US009917035B2

(12) United States Patent
Tseng et al.

(10) Patent No.: US 9,917,035 B2
(45) Date of Patent: Mar. 13, 2018

(54) BUMP-ON-TRACE INTERCONNECTION STRUCTURE FOR FLIP-CHIP PACKAGES

(71) Applicant: Taiwan Semiconductor Manufacturing Co., Ltd., Hsin-Chu (TW)

(72) Inventors: Yu-Jen Tseng, Hsinchu (TW); Yen-Liang Lin, Taichung (TW); Tin-Hao Kuo, Hsinchu (TW); Chen-Shien Chen, Zhubei (TW); Mirng-Ji Lii, Sinpu Township (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 960 days.

(21) Appl. No.: 13/658,895

(22) Filed: Oct. 24, 2012

(65) Prior Publication Data

US 2014/0110847 A1 Apr. 24, 2014

(51) Int. Cl.
*H01L 23/488* (2006.01)
*H01L 23/00* (2006.01)

(52) U.S. Cl.
CPC ............ *H01L 23/488* (2013.01); *H01L 24/13* (2013.01); *H01L 24/16* (2013.01); *H01L 24/81* (2013.01); *H01L 2224/13005* (2013.01); *H01L 2224/13012* (2013.01); *H01L 2224/13083* (2013.01); *H01L 2224/13109* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13166* (2013.01); *H01L 2224/13565* (2013.01); *H01L 2224/13686* (2013.01); *H01L 2224/16058* (2013.01); *H01L 2224/16238* (2013.01);

(Continued)

(58) Field of Classification Search
USPC ................. 257/737, 738, 773, 775, 778–781
See application file for complete search history.

(56) References Cited

U.S. PATENT DOCUMENTS 7,902,666 B1 * 3/2011 Hsu et al. ...................... 257/737
2005/0032349 A1 * 2/2005 Lee et al. ...................... 438/614

(Continued)

OTHER PUBLICATIONS

Official Action dated Apr. 24, 2017 in counterpart German Patent Application No. 102013105084.0.

*Primary Examiner* — Bryan Junge
(74) *Attorney, Agent, or Firm* — Duane Morris LLP

(57) ABSTRACT

A bump-on-trace interconnection structure utilizing a lower volume solder joint for joining a conductive metal pillar and a metal line trace includes a conductive metal pillar having a bonding surface having a width $W_P$ and a metal line trace, provided on a package substrate, having a top surface with a width $W_T$, where $W_P$ is greater than $W_T$. The solder joint is bonded to the bonding surface by wetting across the width $W_P$ and bonded predominantly only to the top surface of the metal line trace by wetting predominantly only to the top surface across the width $W_T$.

18 Claims, 6 Drawing Sheets

(52) U.S. Cl.
CPC ............... *H01L 2224/81815* (2013.01); *H01L 2924/181* (2013.01)

(56) References Cited

U.S. PATENT DOCUMENTS

| | | |
|---|---|---|
| 2012/0032343 A1 | 2/2012 | Lin et al. |
| 2012/0091577 A1 | 4/2012 | Hwang et al. |
| 2012/0098120 A1 | 4/2012 | Yu et al. |
| 2012/0104595 A1* | 5/2012 | Haba et al. .................. 257/737 |
| 2012/0217632 A1 | 8/2012 | Chen et al. |

* cited by examiner

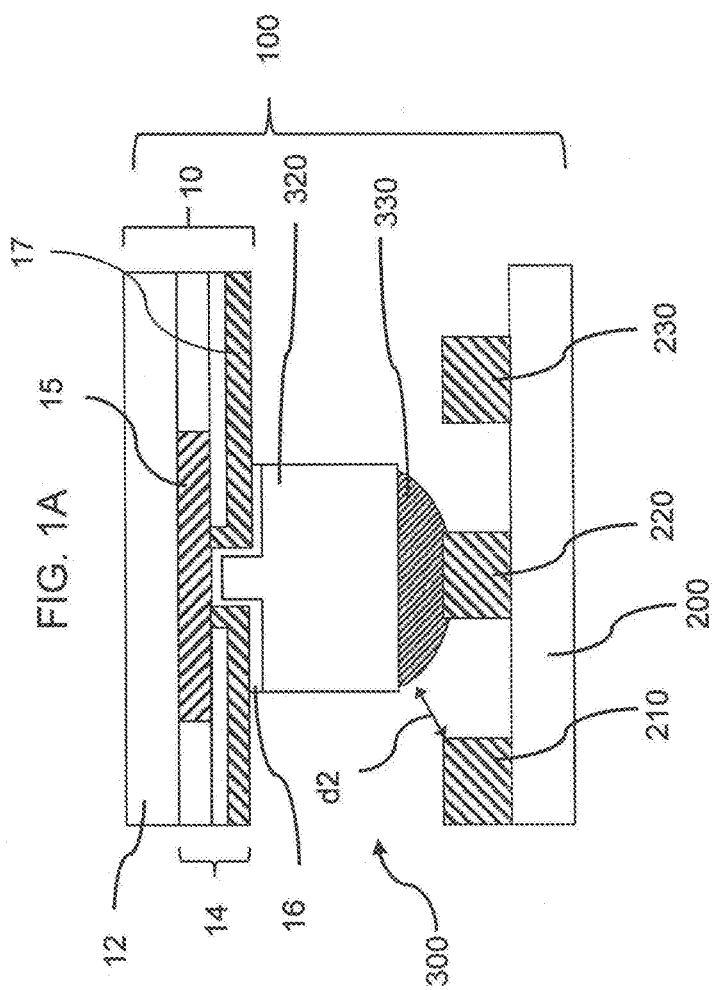

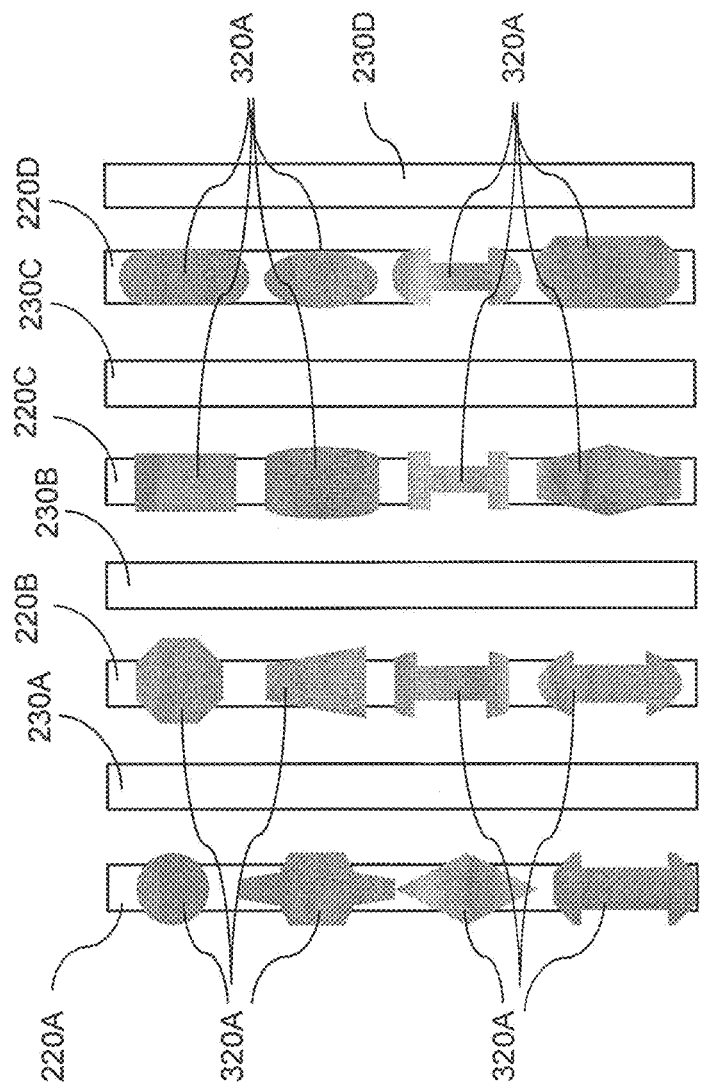

BUMP-ON-TRACE INTERCONNECTION STRUCTURE FOR FLIP-CHIP PACKAGES

FIELD

The disclosed subject matter generally relates to a flip-chip packaging assembly utilizing bump-on-trace interconnections and more specifically to an improved BUMP-ON-TRACE interconnections.

BACKGROUND

Flip-chip package utilizing BUMP-ON-TRACE interconnections have been introduced in the industry to provide finer pitch interconnections compared to the conventional solder bump array interconnection technologies. Bump-on-trace interconnections utilize conductive metal pillars, such as copper (Cu) pillars, joined to metal line traces on the package substrate by a solder joint that establish electrical connection between an integrated circuit (IC) chip's I/O and power pads and the substrate of the flip-chip package.

BRIEF DESCRIPTION OF THE DRAWINGS

All drawings are schematic and are not drawn to scale. Various embodiments of the present disclosure will be described in view of the following drawings where:

FIG. 1A is an illustration showing a cross-sectional view of a bump-on-trace interconnect structure in a flip-chip packaging assembly according to the present disclosure;

FIG. 4 is an illustration showing examples of different shapes for the conductive metal pillars.

DETAILED DESCRIPTION

Figure 1B:
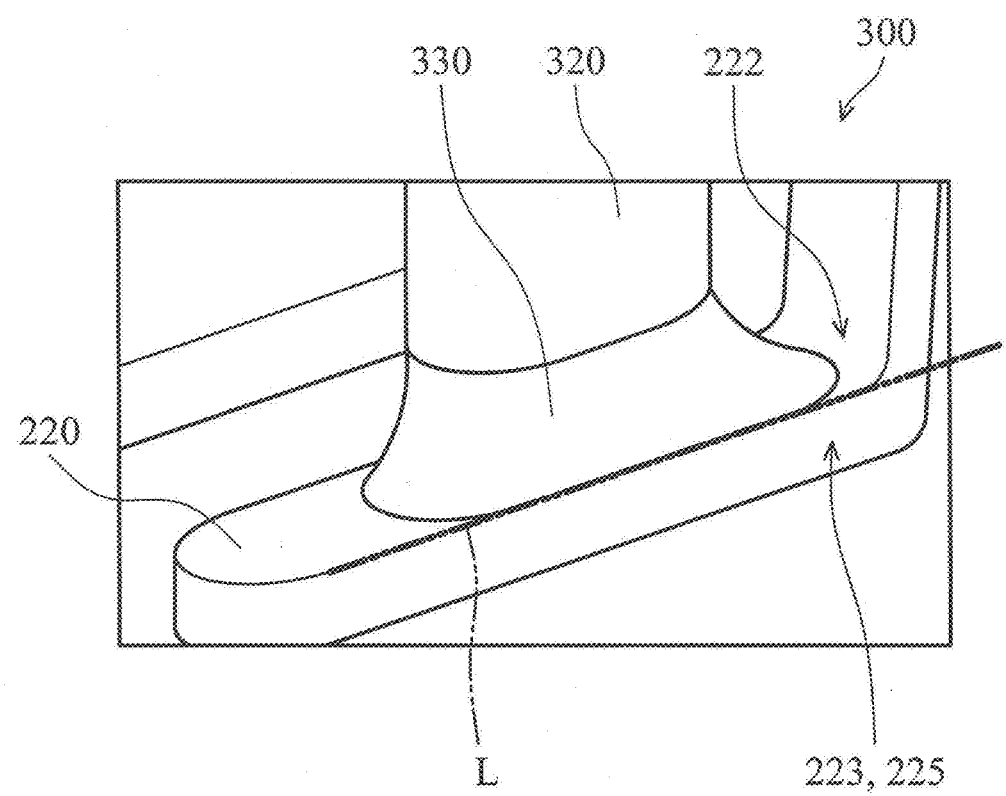
FIG. 1B is an illustration showing a lateral view of the bump-on-trace interconnect structure of FIG. 1A.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

According to an aspect of the present disclosure, a packaging assembly is disclosed. The packaging assembly comprises an IC chip that is bonded to a package substrate. The IC chip comprises a conductive metal pillar having a sidewall and a bonding surface that has a width $W_P$ and the conductive metal pillar is bonded to the package substrate by being bonded to a metal line trace provided on the package substrate. The metal line trace has a top surface that has a width $W_T$ and two sidewalls extending downward from the top surface and having a height $H_T$, wherein $W_P$ is greater than $W_T$. A solder joint joins the conductive metal pillar and the metal line trace. On the conductive metal pillar side, the solder forming the solder joint is bonded to the bonding surface of the conductive metal pillar substantially across the width $W_P$ of the bonding surface of the conductive metal pillar. The wetting of the solder joint during the solder joint reflow process is controlled to limit the solder wetting to the bonding surface only and the sidewall of the conductive metal pillar is exposed solder-free. On the metal line trace side, the solder joint is bonded predominantly only to the top surface of the metal line trace by limiting the solder wetting predominantly only to the top surface across its width $W_T$ during the solder joint reflow process to. The IC chip generally has a plurality of such conductive metal pillars bonded to corresponding metal line traces provided on the package substrate.

According to another aspect of the present disclosure, a bump-on-trace interconnection structure is disclosed. The bump-on-trace interconnection structure comprises a conductive metal pillar having a sidewall and a bonding surface that has a width $W_P$ and a metal line trace provided on a package substrate. The metal line trace has a top surface that has a width $W_T$ and two sidewalls extending downward from the top surface and having a height $H_T$ wherein $W_P$ is greater than $W_T$. A solder joint joins the conductive metal pillar and the metal line trace. On the conductive metal pillar side, the solder forming the solder joint is bonded to the bonding surface of the conductive metal pillar substantially across the width $W_P$ of the bonding surface. On the metal line trace side, the solder joint is bonded predominantly only to the top surface of the metal line trace by wetting predominantly only to the top surface across its width $W_T$ during the solder joint reflow.

According to another aspect of the present disclosure, a packaging assembly comprises an IC chip comprising a conductive metal pillar having a sidewall and a bonding surface that has a width $W_P$, a package substrate having a metal line trace provided thereon, the metal line trace having a top surface that has a width $W_T$ and two sidewalls extending downward from the top surface and having a height $H_T$, wherein $W_P$ is greater that $W_T$, and a solder joint joining the conductive metal pillar and the metal line trace. The solder joint is bonded to the bonding surface of the conductive metal pillar substantially across the width $W_P$ of the bonding surface and bonded predominantly only to the top surface of the metal line trace, wherein the solder joint is further bonded to at least one of the two sidewalls of the metal line trace along a minimum wetting portion of the sidewalls of the metal line trace, wherein the minimum wetting portion of the sidewalls extend downward from the top surface no more than ⅕ of the height $H_T$ of the sidewalls of the metal line trace. Furthermore, the sidewall of the conductive metal pillar is covered with a layer of a metal oxide and the conductive metal pillar is made of copper or a copper-based alloy and the metal oxide is copper oxide.

Referring to FIG. 1A, a cross-sectional view of a representative portion of a flip-chip packaging assembly 100 according to an embodiment of the present disclosure is shown. The flip-chip packaging assembly 100 comprises a bump-on-trace interconnection 300. The packaging assembly 100 comprises an IC chip 10, a package substrate 200, and generally has an array of bump-on-trace interconnections joining the IC chip 10 and the package substrate 200 and form the electrical connections between the IC chip 10 and the metal line traces on the package substrate 200. For purposes of illustration, however, only one bump-on-trace interconnection 300 and three metal line traces 210, 220, 230 are shown as an example.

The IC chip 10 comprises a semiconductor substrate 12, that includes the active devices, wiring layers 14 and stress buffer layers 17. The wiring layers 14 include a plurality of contact regions 15 and under bump metallurgy (UBM) layers 16. A conductive metal pillar 320 formed on the UBM layer 16 is in electrical contact with the contact region 15 and the UBM layer 16. Stress buffer layer 17 reduces or minimizes the stress caused by the mismatch in coefficient of thermal expansion of the IC chip 10 and the package substrate 200.

The conductive metal pillar 320, also referred to as a post or a standoff, can be formed of copper or copper alloys. In forming the flip-chip package assembly, the IC chip 10 is positioned so that the array of conductive metal pillars are aligned over the selected metal line traces and the conductive metal pillars are joined to their respective metal line traces by a solder joint. In FIG. 1A, a solder joint 330 joins the conductive metal pillar 320 to the metal line trace 220 so that the contact region 15 is now electrically connected to the metal line trace 220.

Figure 2:
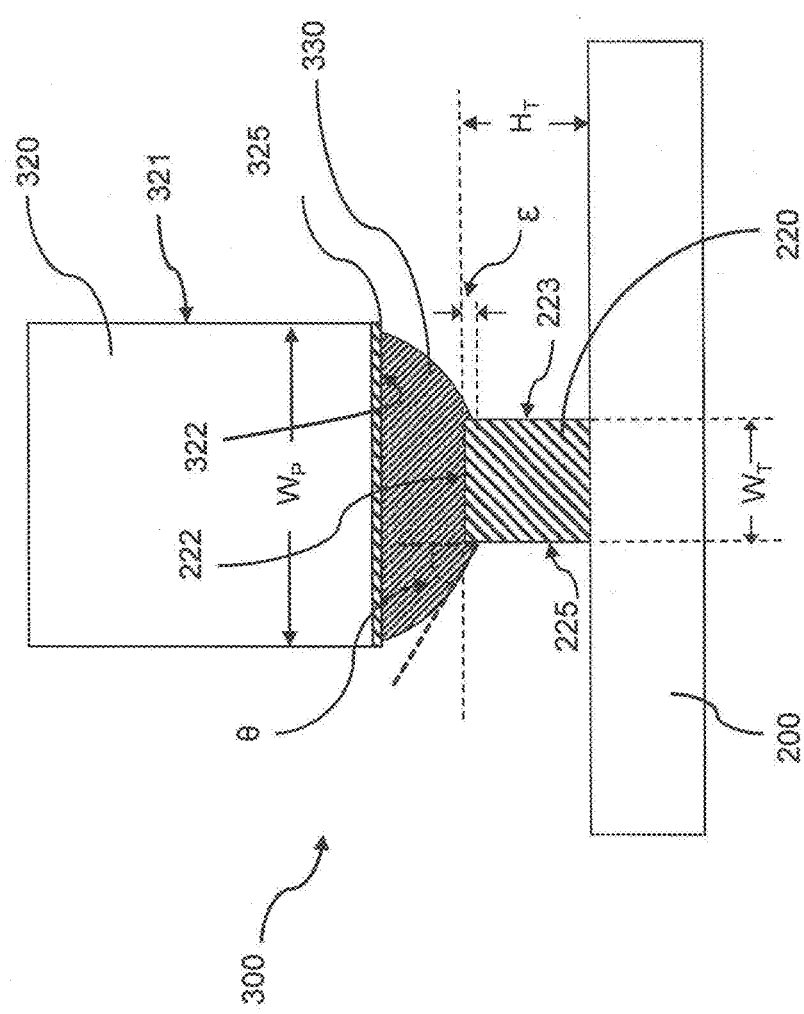
FIG. 2 is an illustration showing the structural details of the bump-on-trace interconnect structure of FIG. 1A.

Referring to FIG. 2, the conductive metal pillar 320 has a sidewall 321 and a bonding surface 322 that has a width $W_P$ for bonding to a solder joint 330. According to an embodiment, the bonding surface 322 can include a metal cap layer 325. The metal cap layer 325 acts as a diffusion barrier that prevents copper from the conductive metal pillar 320 from diffusing into the solder alloy that forms the solder joint 330. The prevention of copper diffusion increases the reliability and bonding strength of the package. The metal cap layer 325 can be nickel, tin, tin-lead, gold, silver, palladium, indium, nickel-palladium-gold, nickel-gold, titanium, or other similar materials or alloys.

The metal line traces 210, 220, 230 on the package substrate 200 generally have a quadrilateral cross-sectional shape as shown and have two sidewalls. As shown in FIG. 2, the metal line trace 220 has a top surface 222 having a width $W_T$ and two sidewalls 223 and 225 having a height $H_T$. The sidewalls are generally vertically oriented.

The solder joint 330 is bonded to the bonding surface 322 of the conductive metal pillar 320 substantially across its width $W_P$ and covers substantially the width $W_P$ of the bonding surface 322. This means that during the reflow cycle of the solder joint, the solder wets across the width $W_P$ of the bonding surface 322 but not along the sidewall 321 of the conductive metal pillar leaving the sidewall 321 exposed. The exposed sidewall 321 will oxidize and be covered with a film of metal oxide. Where the conductive metal pillar is made of copper or copper alloy metal the exposed sidewall 321 will be covered with a film of copper oxide. The presence of this metal oxide film enhances adhesion between the conductive metal pillar and a molding compound or an under-fill compound that will be subsequently applied to the space between the IC chip and the package substrate. The molding compounds and the under-fill compounds are applied to improve the reliability of the package assembly by restraining the IC chip and the package substrate and reduces or minimizes the stress caused by the mismatch in coefficient of thermal expansion. And improving the adhesion between the conductive metal pillars 320 and the molding compound or the under-fill compound will enhance the beneficial effect of the molding compound. The use of such molding compounds and the under-fill compounds are well known in the art.

At the metal line trace side, the solder joint 330 is bonded to the metal line trace 220 by wetting and bonding predominantly only to the top surface 222 of the metal line trace 220 across its width $W_T$. In the bump-on-trace interconnection of the present disclosure, $W_P$ is greater than $W_T$.

According to another aspect of the present disclosure, the solder joint 330 wetting and bonding predominantly only to the top surface 222 of the metal line trace 220 means the solder joint 330 can be bonded to at least one of the two sidewalls 223, 225 of the metal line trace along a minimum wetting portion $\in$ of the sidewalls 223, 225 of the metal line trace 220. The minimum wetting portion $\in$ of the sidewalls extending downward from the top surface no more than $\frac{1}{5}$ of the height $H_T$ of the sidewalls 223, 225. In this context, the term "downward" means away from the conductive metal pillar 320 and toward the package substrate 200. In a preferred embodiment, the minimum wetting portion $\in$ is no more than $\frac{1}{15}$ of the height $H_T$ of the sidewalls 223, 225. The solder joint 330 wets the sidewalls 223, 225 with a solder wetting angle $\theta$ of between about 18° to 73° and more preferably with a solder wetting angle of about 40°. FIG. 1B is a lateral view of a bump-on-trace interconnect structure 300 of FIGS. 1A and 2 showing the solder joint 330 wetting and bonding predominantly only to the top surface 222 of the metal line trace 220. A phantom line L is provided to delineate the top surface 222 from the sidewall 223, 225 of the metal line trace 220.

Some examples of the solders that can be used to form the solder joint 330 are solders made of Sn, SnAg, SnPb, SnAgCu (with Cu weight percentage less than 0.3%), SnAgZn, SnZn, SnBi—In, Sn—In, Sn—Au, SnCu, SnZnIn, or SnAgSb, etc. Such solders are well known in the art and one of ordinary skill in the art would know the solder reflow process for forming a solder joint in a bump-on-trace interconnection.

Figure 3A:
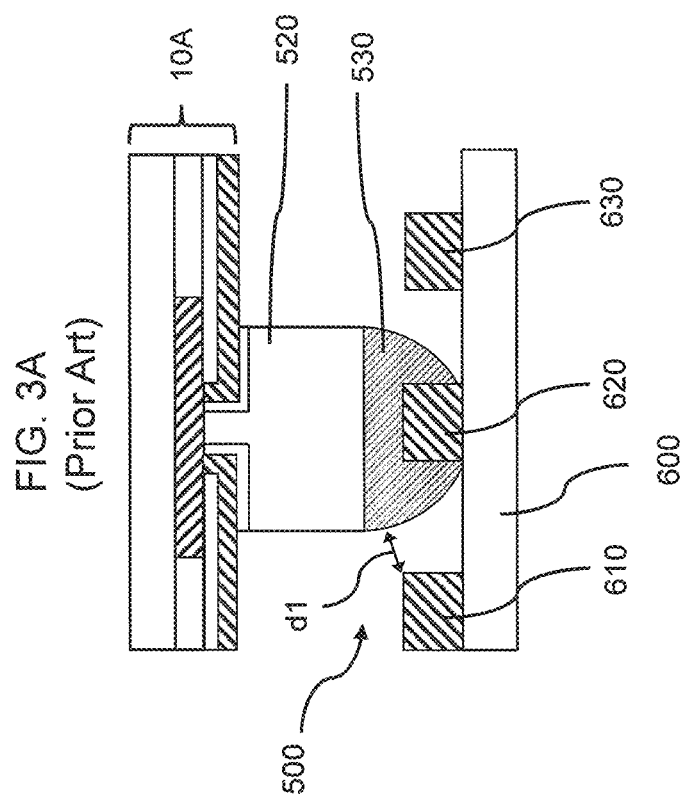
FIG. 3A is an illustration showing a conventional bump-on-trace interconnect structure.
Figure 3B:
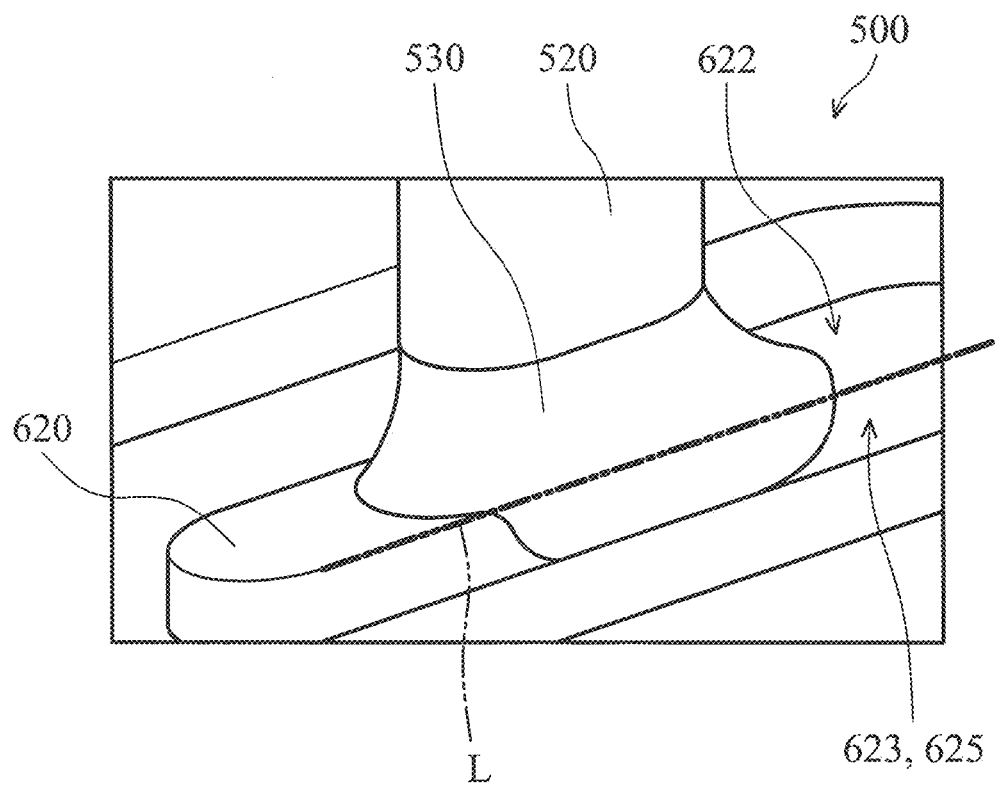
FIG. 3B is an illustration showing a lateral view of the conventional bump-on-trace interconnect structure of FIG. 3A.

Compared to the conventional bump-on-trace interconnect structure 500 shown in FIG. 3A, the novel and improved structure of the bump-on-trace interconnection 300 disclosed herein provides a number of benefits. In the conventional bump-on-trace interconnect structure 500, the solder joint 530 joining the conductive metal pillar 520 to the metal line trace 620 is bonded to sidewalls 623 and 625 along the full height of the side walls of the metal line trace 620 all the way down to the package substrate 600 as well as the top surface 622 of the metal line trace 620. In this conventional structure, the distance d1 between the solder joint 530 and the neighboring metal line trace 610 can be often bridged by abnormally large outlier solder joints and cause electrical shorts. Also, because the solder joint 530 is larger and wets along the full height of the sidewalls 623, 625 down to the package substrate, the solder joint is stiff and tend to transmit higher stress to the ELK layers and can cause ELK delamination defects in the IC chip 10A. The solder joint 530 also transmits higher stress to the interface between the metal line trace 620 and the package substrate 600 and can cause metal line trace peeling. The source of these stresses is the differences in the coefficients of thermal expansion of the IC chip and the package substrate. FIG. 3B is a lateral view of the conventional bump-on-trace interconnect structure 500 and shows the solder joint 530 wetting along the full height of the sidewalls 623, 625 of the metal line trace 620 down to the package substrate. The phantom line L is provided to delineate the top surface 622 from the sidewall 623, 625 of the metal line trace 620.

The novel and beneficial structure of the bump-on-trace interconnect structure 300 shown in FIGS. 1A, 1B and 2 are achieved by using a reduced volume of solder for the solder joint 330 to limit the solder joint to wet only to the bonding surface of the conductive metal pillar 320 and to wet predominantly only on the top surface 222 of the metal line trace 220. This configuration results in the distance d2 between the solder joint 330 and the neighboring metal line trace 210 to be larger than the distance d1 in the conventional bump-on-trace interconnect structure 500. This increased clearance distance d2 reduces the likelihood of unwanted bridging between the solder joint 330 and the neighboring metal line traces. Additionally, because the solder joint 330 has a smaller volume and shorter than the solder joint 530 of the conventional bump-on-trace interconnect structure 500, the solder joint 330 is more compliant compared to the conventional bump-on-trace solder joint 530. This reduces the thermally induced stress transmitted to the ELK layers in the IC chip 10 and the metal line trace to package substrate interface, thus, reducing the chances of delamination or peeling in these structures.

According to an aspect of the present disclosure, the conductive metal pillars 320 can be provided in a variety of shapes in their lateral cross-section (i.e. a cross-section taken along a plane parallel to the IC chip 10 or the package substrate 200. The conductive metal pillars 320 often have a circular cross-section in many applications, they can be provided to have a variety of cross-sectional shapes such as an oval, an ellipse, a capsule-like elongated shape, a diamond shape, a hexagon, an octagon, a rectangle, a ladder-shape, or the like. These various examples of cross-sectional shapes for conductive metal pillars 320A are illustrated in FIG. 4. FIG. 4 is a plan view looking down to the metal line traces 220A, 230A, 220B, 230B, 220C, 230C, 220D, and 230D. The cross-sectional shape of the conductive metal pillar, in turn, will result is corresponding shape of the solder joint 330. Depending on the particular application, the design criteria for the IC package may require a particular cross-sectional shape for the conductive metal pillar and the solder joint.

The bump-on-trace interconnection of the present disclosure provides many advantages to the packaging assembly. For example, the bump-on-trace interconnection of the present disclosure reduces or minimizes bump to trace line bridging failures by increasing the spacing d2 between the solder joint 330 and the nearby metal line traces (escape lines) 210, 230. Conversely, when allowing for the same process capability in terms of the bump to trace line bridging failures, increasing the spacing d2 between the solder joint 330 and the neighboring metal line traces allows the metal line traces to be placed closer together and achieve more aggressive metal spacing rule.

Additionally, the bump-on-trace interconnection of the present disclosure allows more robust window for ELK (Extreme low-k dielectric) delamination and metal trace peeling. Conversely, when allowing for the same process capability, the dimensions of the Cu conductive metal pillar can be reduced and achieve more aggressive metal spacing rule.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A packaging assembly comprising:
   an IC chip comprising a conductive metal pillar having a sidewall and a bonding surface that has a width $W_P$;
   a package substrate having a metal line trace provided thereon, the metal line trace having a top surface that has a width $W_T$ and two sidewalls extending downward from the top surface and having a height $H_T$, wherein $W_P$ is greater that $W_T$; and
   a solder joint joining the conductive metal pillar and the metal line trace, wherein the solder joint is bonded to the bonding surface of the conductive metal pillar substantially across the width $W_P$ of the bonding surface and bonded predominantly to the top surface of the metal line trace and the solder joint is bonded to at least one of the two sidewalls of the metal line trace along a limited wetting portion of the sidewalls of the metal line trace, wherein the limited wetting portion of the sidewalls extend downward from the top surface no more than ⅕ of the height $H_T$ of the sidewalls of the metal line trace.

2. The assembly of claim 1, wherein the sidewall of the conductive metal pillar is covered with a layer of a metal oxide.

3. The assembly of claim 2, wherein the conductive metal pillar is made of copper or a copper-based alloy and the metal oxide is copper oxide.

4. The assembly of claim 1, wherein the solder joint wets the sidewalls of the metal line trace with a solder wetting angle between 18° to 73°.

5. The assembly of claim 1, further wherein the solder joint wets the sidewalls of the metal line trace with a solder wetting angle of about 40°.

6. The assembly of claim 1, wherein the solder joint wets the sidewalls of the metal line trace with a solder wetting angle between 18° to 73°.

7. The assembly of claim 1, wherein the solder joint wets the sidewalls of the metal line trace with a solder wetting angle of about 40°.

8. The assembly of claim 1, wherein the bonding surface of the conductive metal pillar is provided with a metal cap layer.

9. A bump-on-trace interconnection structure comprising:
   a conductive metal pillar having a sidewall and a bonding surface that has a width $W_P$;
   a metal line trace provided on a package substrate, the metal line trace having a top surface that has a width $W_T$ and two sidewalls extending downward from the top surface and having a height $H_T$, wherein $W_P$ is greater than $W_T$; and
   a solder joint joining the conductive metal pillar and the metal line trace, wherein the solder joint is bonded to the bonding surface of the conductive metal pillar substantially across the width $W_P$ of the bonding surface and bonded predominantly to the top surface of the metal line trace and the solder joint is bonded to at least one of the two sidewalls of the metal line trace along a limited wetting portion of the sidewalls, wherein the limited wetting portion of the sidewalls extend downward from the top surface no more than ⅕ of the height $H_T$ of the sidewalls of the metal line trace.

10. The structure of claim 9, wherein the sidewall of the conductive metal pillar is covered with a layer of a metal oxide.

11. The structure of claim 10, wherein the conductive metal pillar is made of copper or a copper-based alloy and the metal oxide is copper oxide.

12. The structure of claim 9, further wherein the solder joint wets the sidewalls of the metal line trace with a solder wetting angle between 18° to 73°.

13. The structure of claim 9, further wherein the solder joint wets the sidewalls of the metal line trace with a solder wetting angle of about 40°.

14. The structure of claim 9, further wherein the solder joint wets the sidewalls of the metal line trace with a solder wetting angle between 18° to 73°.

15. The structure of claim 9, further wherein the solder joint wets the sidewalls of the metal line trace with a solder wetting angle of about 40°.

16. A packaging assembly comprising:
an IC chip comprising a conductive metal pillar having a sidewall and a bonding surface that has a width $W_P$;
a package substrate having a metal line trace provided thereon, the metal line trace having a top surface that has a width $W_T$ and two sidewalls extending downward from the top surface and having a height $H_T$, wherein $W_P$ is greater that $W_T$; and
a solder joint joining the conductive metal pillar and the metal line trace, wherein the solder joint is bonded to the bonding surface of the conductive metal pillar substantially across the width $W_P$ of the bonding surface and bonded predominantly to the top surface of the metal line trace and the solder joint is bonded to at least one of the two sidewalls of the metal line trace along a limited wetting portion of the sidewalls of the metal line trace, wherein the limited wetting portion of the sidewalls extend downward from the top surface no more than ⅕ of the height $H_T$ of the sidewalls of the metal line trace,
wherein the sidewall of the conductive metal pillar is covered with a layer of a metal oxide,
wherein the conductive metal pillar is made of copper or a copper-based alloy and the metal oxide is copper oxide.

17. The assembly of claim 16, wherein the solder joint wets the sidewalls of the metal line trace with a solder wetting angle between 18° to 73°.

18. The assembly of claim 16, further wherein the solder joint wets the sidewalls of the metal line trace with a solder wetting angle of about 40°.

* * * * *